United States Patent [19]
Demicheli et al.

[11] Patent Number: 5,300,805
[45] Date of Patent: Apr. 5, 1994

[54] EPITAXIAL TUB BIAS STRUCTURE FOR INTEGRATED CIRCUITS

[75] Inventors: Marco Demicheli, Binago; Alberto Gola, Broni, both of Italy

[73] Assignee: SGS-Thomson Microelectronics S.r.l., Agrate Brianza, Italy

[21] Appl. No.: 85,314

[22] Filed: Jun. 29, 1993

[30] Foreign Application Priority Data

Jun. 30, 1992 [EP] European Pat. Off. ........ 92830338.7

[51] Int. Cl.[5] ...................... H01L 27/02; H01L 27/04
[52] U.S. Cl. ................................... 257/546; 257/503; 257/545; 257/547; 257/552; 257/553; 257/565; 307/276.2; 307/296.6; 307/303.1
[58] Field of Search ............... 257/499, 503, 545, 546, 257/547, 552, 553, 565; 307/296.2, 296.6, 296.7, 303.1

[56] References Cited

U.S. PATENT DOCUMENTS

| | | | |
|---|---|---|---|
| 3,829,709 | 8/1974 | Maigret et al. | 307/202 |
| 4,578,695 | 3/1986 | Delaporte et al. | 257/546 |
| 4,897,757 | 1/1990 | Tailliet et al. | 257/546 |
| 5,051,612 | 9/1991 | Agiman | 307/296.2 |

FOREIGN PATENT DOCUMENTS 0284979  5/1988  European Pat. Off. .

*Primary Examiner*—Ngan Ngo
*Attorney, Agent, or Firm*—Wolf, Greenfield & Sacks

[57] ABSTRACT

A bias structure for an integrated circuit including first and second transistors having emitter terminals coupled respectively to the supply and to a terminal of a resistor whose potential, under certain operating conditions of the circuit, exceeds the supply voltage; base terminals connected to each other and to a current source; and collector terminals connected electrically (12) to an epitaxial tub housing the resistor. A resistor is preferably provided between the two collectors, so that, when the potential of the terminal of the resistor exceeds the supply voltage, the second transistor saturates and maintains the epitaxial tub of the resistor at a potential close to that of the resistor terminal, thus preventing the parasitic diode formed between the resistor and the epitaxial tub from being switched on.

22 Claims, 2 Drawing Sheets

EPITAXIAL TUB BIAS STRUCTURE FOR INTEGRATED CIRCUITS

BACKGROUND OF THE INVENTION

1. Field of the Invention

The present invention relates to an epitaxial tub bias structure for integrated circuits comprising at least one epitaxial tub housing regions whose potential, under certain operating conditions of the circuit, may exceed the supply voltage.

2. Discussion of the Related Art

In integrated circuits that drive inductive loads, the possibility exists that the output potential may exceed the supply voltage, which phenomenon creates serious problems in the event that the output is connected to components on the integrated circuit, such as internal resistors or PN junction capacitors. By way of illustration, FIG. 1 shows a cross section of a chip 1 of semiconductor material, comprising a P type substrate 2, and an N-type epitaxial tub 3 electrically isolated from the adjacent tubs by diffused P+ type isolation regions 4. The N-type epitaxial tub 3 also houses an elongated P-type layer 5 (forming a resistor 6 indicated by the dotted line and forming part of integrated circuit 15) terminating at either end in two P+ type regions 7, 8 on which are formed contacts 9, 10. Tub 3 also houses an N+ type region 11 on which is formed a contact 12 for biasing the tub.

In the FIG. 1 structure, if the potential of either one of the end regions of resistor 6, e.g. region 7, exceeds that of tub 3, as determined for example by contact 12, the equivalent diode formed by the PN junction between region 7 and tub 3 (shown schematically by 13) may be turned on and conduct such a high current so as to charge the parasitic equivalent capacitor formed between tub 3 and substrate 2 (shown schematically by 14), and/or turn on parasitic transistors formed by region 7, tub 3 and substrate 2, or by any other components including P type, regions integrated in tub 3, thus resulting in impaired operation of the circuit, high power loss, and even irreparable damage to this part of the integrated circuit.

Consequently, if the integrated circuit on chip 1 is designed to operate under conditions wherein the potential of either one of the P-type regions integrated in and forming a junction with tub 3 exceeds the supply voltage, the tub cannot be connected directly to the supply.

Various solutions have been devised for solving the above problem, such as providing for a floating tub or connecting it to the supply via a diode. The latter solution is shown in FIG. 2, which shows a view in perspective of a portion of a chip 18 of conducting material, again comprising a substrate 2 and an epitaxial tub 3. Tub 3 (or another tub not shown but connected electrically to tub 3) houses a P-type region 19 connected by a contact 20 to supply voltage $V_{CC}$ and forming a diode 21 with tub 3. Tub 3 also houses P-type region 5 forming resistor 6, one terminal of which may present a higher potential than $V_{CC}$, and a further P-type region 22 defining a further resistor 23 integrated in tub 3. In the FIG. 2 structure, regions 6, 23 and tub 3 form a parasitic PNP transistor 24, and region 5, tub 3 and substrate 2 form a further parasitic PNP transistor 25. FIG. 2 also shows two parasitic capacitors 26, 27, formed by substrate 2 and tub 3, located between the bases of parasitic transistors 24, 25 and substrate 2.

In the FIG. 2 structure, and also in the case of a floating tub, any leading edges of the potential at either one of the terminals (not shown) of resistor 6 switch on parasitic diode 13 between the terminal and tub 3 (as shown in FIG. 1). The resulting current pulse generated by the diode charges the parasitic capacitance between tub 3 and substrate 2; and, during the current pulse, the resistance of resistor 6 falls sharply so that parasitic transistor 24 and/or 25 may also be switched on. As such, the FIG. 2 structure also fails to provide a solution to the problem.

Another solution consists in forming a Schottky diode between the epitaxial tub and the P-type region whose potential may exceed the supply voltage. Schottky diodes are in fact switched on by lower direct bias voltages as compared with PN junctions, so that, when connected as described above, a Schottky diode would be switched on immediately, thus shortcircuiting the junction formed by the P region and the tub, and so preventing the parasitic diode and transistors from being switched on. Such a solution, however, is only applicable to processes that allow the formation of Schottky diodes.

It is an object of the present invention to provide a tub bias structure for preventing turn-on of the parasitic diode between the tub and the region whose potential may exceed that of the tub, and which is producible regardless of the integration process involved.

SUMMARY OF THE INVENTION

According to the present invention, there is provided an epitaxial tub bias structure for integrated circuits.

According to the present invention, a first transistor is connected between the supply voltage and the epitaxial tub, and is switched on under normal operating conditions wherein none of the regions presents a potential higher than the supply voltage. In this situation, a second transistor, connected between the epitaxial tub and a region whose potential may exceed the supply voltage, and having the base terminal connected to that of the first transistor, is disabled. Conversely, when the emitter potential of the second transistor exceeds the supply voltage, the second transistor saturates, so as to maintain a tub potential close to that of the region whose potential is higher than the supply voltage; thereby shortcircuiting the parasitic diode formed between said region and the tub and preventing the parasitic diode from being switched on under any operating condition.

BRIEF DESCRIPTION OF THE DRAWINGS

A preferred, non-limiting embodiment of the present invention will be described by way of example with reference to the accompanying drawings, in which.

DETAILED DESCRIPTION

Figure 3:
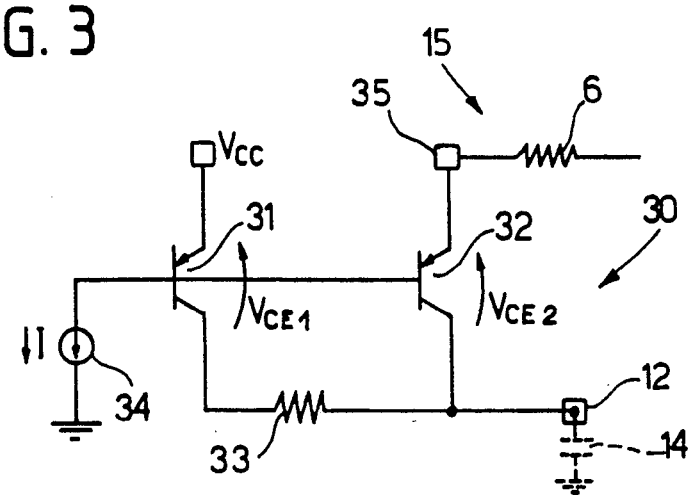
FIG. 3 shows a circuit diagram of the structure according to the present invention.

In FIG. 3, which shows resistor 6 of integrated circuit 15, parasitic capacitor 14, and contact 12 for biasing tub 3, the bias structure according to the present invention is indicated as a whole by 30, and comprises a pair of PNP type transistors 31, 32, and a resistor 33. More specifically, transistor 31 has its emitter terminal connected to supply voltage $V_{CC}$, its base terminal connected to the base of transistor 32 and to a bias current source 34 generating current I, and its collector terminal connected to one terminal of resistor 33. The other terminal of resistor 33 is connected to the collector terminal of transistor 32 and to contact 12 for biasing tub 3. The emitter terminal of transistor 32 is connected to terminal 35 of resistor 6, the potential of which may exceed supply voltage $V_{CC}$.

Figure 1:
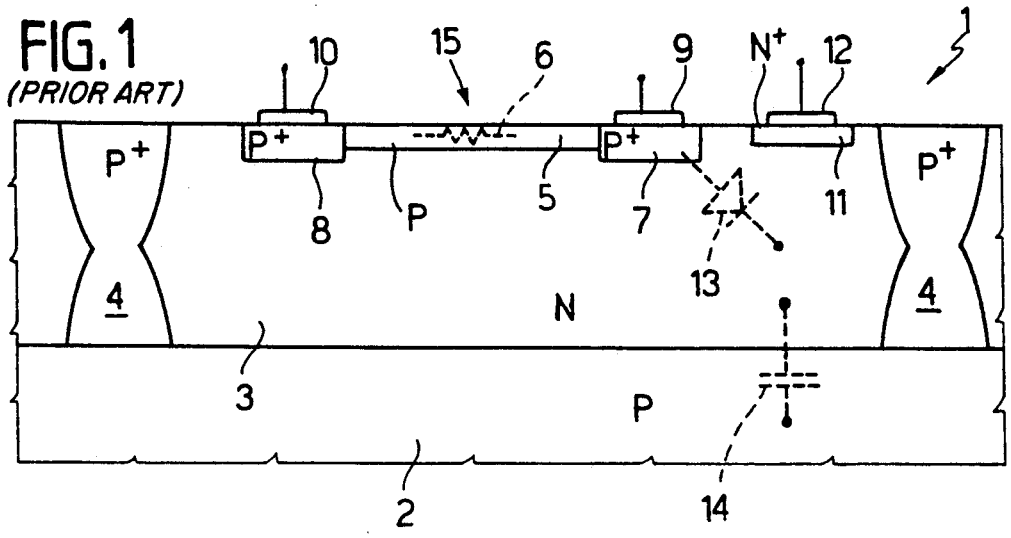
FIG. 1 shows a cross section of a chip of semiconductor material of a known integrated circuit.
Figure 4:
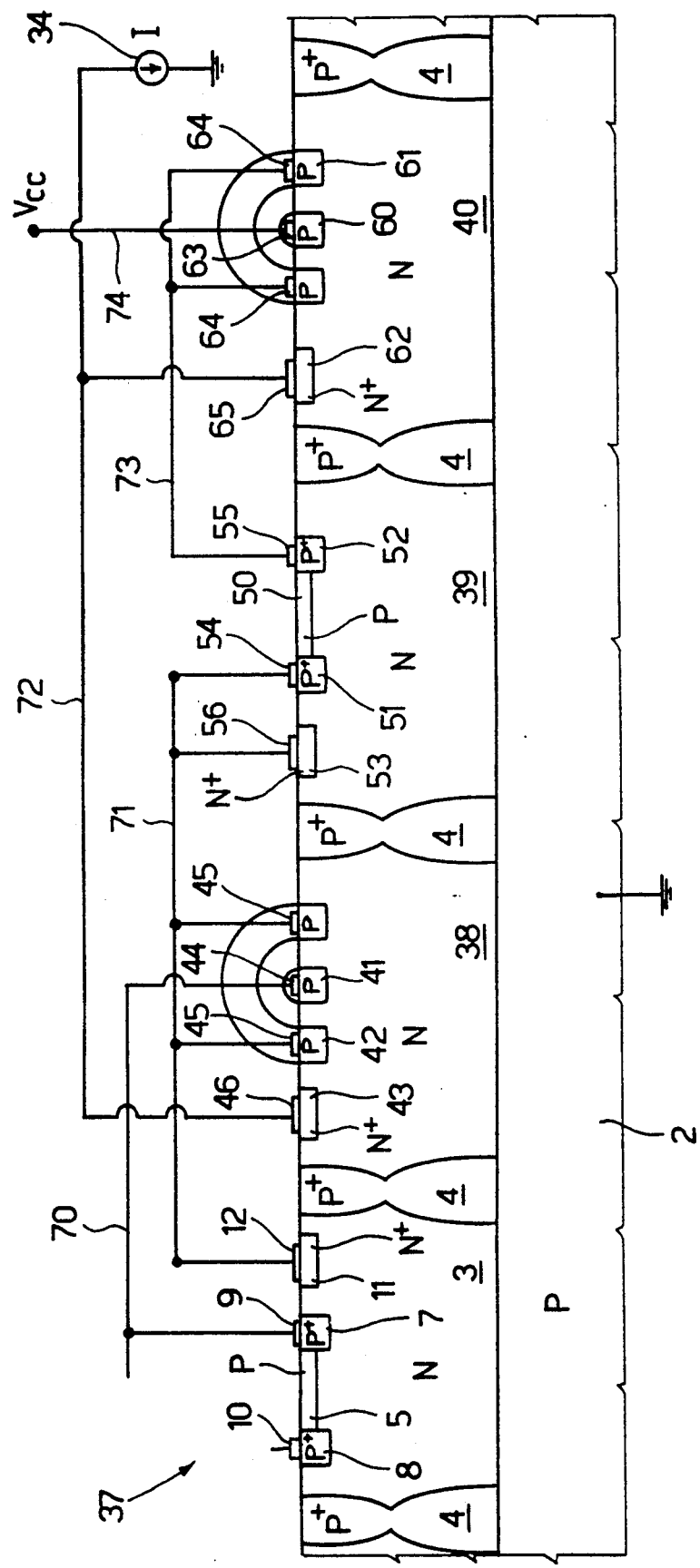
FIG. 4 shows a cross section (not to scale) of a chip of semiconductor material integrating the structure according to the present invention.

One implementation of the FIG. 3 structure is shown in FIG. 4, which shows a cross section of a silicon chip 37, and in which any parts common to those of FIG. 1 are shown using the same reference characters. Substrate 2 in FIG. 4 has a number of epitaxial tubs including tub 3 housing resistor 6; and tubs 38, 39 and 40 in which transistor 32, resistor 33 and transistor 31 are formed respectively. Tubs 3, 38-40 are mutually isolated by diffused layers 4.

As in FIG. 1, tub 3 includes P-type region 5 and P+ type regions 7 and 8 forming resistor 6; N+ type region 11 for biasing the tub; and contacts 9, 10 and 12 on respective regions 7, 8 and 11.

Tub 38, integrating transistor 32 in the form of a lateral transistor, includes a central P-type region 41 forming the emitter of transistor 32; an annular P-type region 42 remotely surrounding region 41 and forming the collector of transistor 32; and an N+ type region 43 for biasing tub 38. The portion of tub 38 between regions 41 and 42 defines the base of transistor 32, and contacts 44, 45 and 46 are provided on tub 38 and connected respectively to regions 41, 42 and 43.

Tub 39, integrating resistor 33, includes an elongated P-type region 50; two P+ type end regions 51 and 52 at either end of region 50; an N+ type region 53 for biasing tub 39; and contacts 54, 55 and 56 on tub 39 and connected respectively to regions 51, 52 and 53.

Lastly, tub 40, integrating transistor 31 in the form of a lateral transistor, presents a central P type region 60 forming the emitter of transistor 31; an annular P type region 61 remotely surrounding region 60 and forming the collector of transistor 31; and an N+ type region 62 for biasing tub 40. The portion of tub 40 between regions 60 and 61 forms the base of transistor 31, and contacts 63, 64 and 65 are provided on tub 40 and connected respectively to regions 60, 61 and 62.

The chip 37 regions are connected electrically by metal lines, via the respective contacts, to produce the FIG. 3 configuration. Said lines, shown only schematically in FIG. 4, comprise line 70 for connecting region 7 of resistor 6 with emitter region 41 of transistor 32; line 71 for connecting bias region 11 of tub 3 with annular collector region 42 of transistor 32, bias region 53 of tub 39, and region 51 forming one end of resistor 33; line 72 for connecting bias region 43 of tub 38 (base region of transistor 32) with bias region 62 of tub 40 (base region of transistor 31) and connecting them to current source 34; and line 73 for connecting region 52 forming the other end of resistor 33 with collector region 61 of transistor 31. The emitter region 60 of transistor 31 is supplied with supply voltage $V_{CC}$ via line 74.

Structure 30 operates as follows. When the potential of terminal 35 of resistor 6 is less than the supply voltage $V_{CC}$, transistor 31 is saturated and transistor 32 disabled; and tub 3 is biased to supply voltage $V_{CC}$ minus the voltage drop caused by the emitter-collector saturation voltage of transistor 31 ($V_{CE1,sat}$) and resistor 33 ($V_R$), i.e.

$$V_{epi} = V_{CC} - V_{CE1,sat} - V_R$$

In this phase, transistor 31 has a very low collector current, by virtue of it only driving the equivalent capacitor 14 consisting of the parasitic capacitance between tub 3 and substrate 2. Resistor 33 prevents reverse operation of transistor 32 and so prevents transistor 32 from supplying current to resistor 6, by virtue of the small voltage drop of resistor 33 reducing that of the base-collector junction of transistor 32. Even in the event of a small amount of current flowing through transistor 32 despite resistor 33, this is entirely negligible at this phase by virtue of being no more than a few microamps, whereas that required for driving inductive loads (connected to resistor 6) is generally in the order of a few hundred milliamps.

Figure 2:
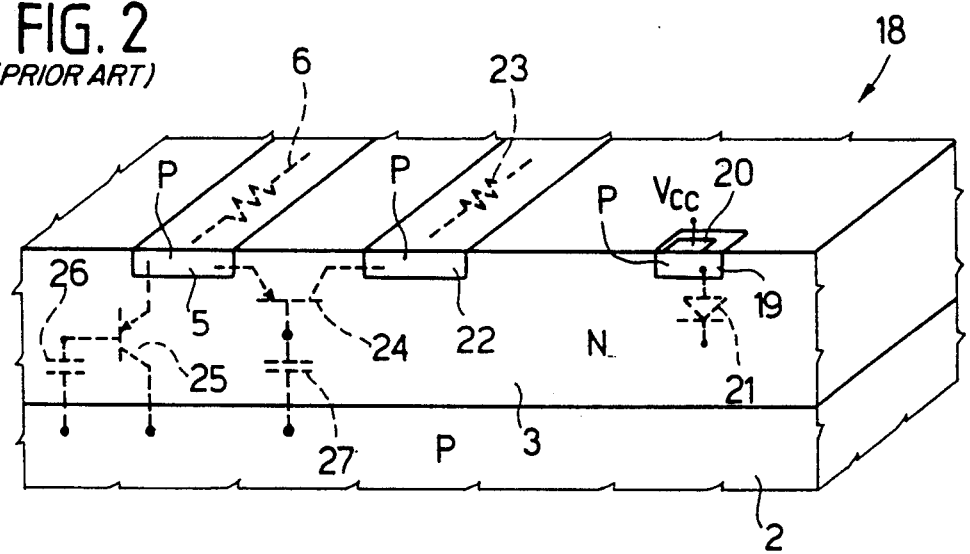
FIG. 2 shows a view, in perspective, of a portion of a known integrated circuit including an epitaxial tub bias structure.

Conversely, when the output potential of integrated circuit 15 increases, so that the voltage of terminal 35 exceeds $V_{CC}$, transistor 31 is disabled and transistor 32 saturated; the potential of tub 3 increases along with the potential of terminal 35 of resistor 6, minus voltage drop $V_{CE1,sat}$ between the emitter and collector of transistor 32. By virtue of the potential difference between terminal 35 and tub 3 never exceeding voltage drop $V_{CE2,sat}$, the parasitic diode formed by the PN junction between region 7 and tub 3, and consequently also any parasitic transistors (such as 24, 25 in FIG. 2), are prevented from being switched to prevent malfunctioning or failure of the integrated circuit.

In this case also, with transistor 32 saturated, resistor 33 provides for limiting the current which could result in reverse operation of transistor 31. As described in connection with transistor 31, the collector current of transistor 32 is practically zero, by virtue of it driving a capacitive load consisting of equivalent capacitor 14. Consequently, bias current I of source 34 may be extremely low, thus drastically reducing power consumption of the circuit as a whole under any operating condition.

The advantages of the structure according to the present invention will be clear from the foregoing description. Firstly, it provides for a straightforward solution, in terms of both design and manufacture, to the problem of preventing the parasitic diode from being switched on, the proposed structure being producible using any manufacturing process and, as such, applicable to any type of integrated circuit.

Secondly, the structure described requires only a very small integration area, by virtue of the straightforward design and small number of component parts of the circuit, which also provide for a high degree of reliability and low-cost integration.

Lastly, by virtue of the low current requirement involved, the value of which is in no way critical, current source 34 need not be particularly precise; and any problems in terms of dissipation are eliminated by the low current supply to the structure under all operating conditions.

To those skilled in the art it will be clear that changes may be made to the structure as described and illustrated herein without, however, departing from the scope of the present invention. Such alterations, modifications, and improvements are intended to be part of this disclosure and are intended to be within the spirit and scope of the invention. Accordingly, the foregoing description is by way of example only and is not intended as limited. The invention is limited only as defined in the following claims and the equivalents thereto.

What is claimed is:

1. An epitaxial tub bias structure for an integrated circuit including at least one epitaxial tub biased to a reference potential and housing at least one region whose potential, in at least one operating mode, exceeds the reference potential, comprising a first and a second transistor, each having a first and second terminal and a control terminal, the first terminal of said first transistor being biased to the reference potential, the first terminal of the second transistor being connected to the at least one region, the control terminals being connected to each other, and the second terminals of the first and second transistors being connected to each other and to the epitaxial tub.

2. The bias structure of claim 1, wherein the first and second transistors are bipolar transistors, the first terminal is an emitter terminal, the second terminal is a collector terminal, and the control terminal is a base terminal.

3. The bias structure of claim 2, wherein the integrated circuit comprises a P-type substrate, the epitaxial tub is N-type, and the at least one region is P-type, and the first and second transistors are PNP type transistors.

4. The bias structure of claim 2, further comprising a current source connected to the base terminals of the first and second transistors.

5. The bias structure of claim 1, further comprising a resistive element coupled between the second terminals of the first and second transistors.

6. The bias structure of claims 1, wherein the first and second transistors are integrated in respective epitaxial tubs separated from the epitaxial tub biased to the reference potential and the second terminals are connected to the epitaxial tub biased to the reference potential via metal connections extending over the epitaxial tubs.

7. An integrated circuit including at least one epitaxial tub biased to a reference potential and housing at least one region whose potential, in at least one operating mode, exceeds the reference potential, and a bias structure for biasing the epitaxial tub comprising a first transistor and a second transistor, each having a first terminal, a second terminal, and a control terminal, the first terminal of the first transistor being biased to the reference potential, the first terminal of the second transistor being connected to the at least one region, the control terminals being connected to each other and the second terminals of the first and second transistors being connected to each other and to the epitaxial tub.

8. The integrated circuit of claim 7, further comprising a P-type substrate, and at least first, second, third, and fourth N-type epitaxial tubs mutually separated by a number of P-type isolation regions, the first epitaxial tub housing the at least one region, the second epitaxial tub housing the first transistor, the third epitaxial tub housing the second transistor, and the fourth epitaxial tub housing a resistive element connected in series between the second terminals of the first and second transistors, the second terminal of the second transistor being connected to the first epitaxial tub by a metal connection extending over the epitaxial tubs.

9. The integrated circuit of claim 8, wherein the first and second transistors are lateral bipolar transistors.

10. An epitaxial tub bias structure for an integrated circuit, comprising:
at least one epitaxial tub coupled to and biased by a supply voltage, the epitaxial tub having at least one region capable of having a voltage greater than the supply voltage;
a first electronic switch, coupled between the supply voltage and the epitaxial tub, that is switched on when the voltage of the at least one region is not greater than the supply voltage and switched off when the voltage of the at least one region is greater than the supply voltage; and
a second electronic switch, coupled between the at least one region and the epitaxial tub, that is switched off when the voltage of the at least one region is not greater than the supply voltage and switched on when the voltage of the at least one region is greater than the supply voltage, so as to maintain a voltage of the epitaxial tub substantially equal to a voltage of the at least one region.

11. The epitaxial tub bias structure of claim 10, further comprising a resistive element coupled between the first and second electronic switches.

12. The epitaxial tub bias structure of claim 11, further comprising a current source coupled to and biasing the first and second electronic switches.

13. The epitaxial tub bias structure of claim 12, wherein at least one of the first and second electronic switches is a bipolar transistor.

14. The epitaxial tub bias structure of claim 13, wherein the first and second electronic switches are bipolar transistors.

15. The epitaxial tub bias structure of claim 14, wherein the bipolar transistors are PNP transistors.

16. The epitaxial tub bias structure of claim 15, wherein the PNP transistors are lateral PNP transistors.

17. The epitaxial tub bias structure of claim 16, wherein the lateral PNP transistors include a collector, an emitter, and a base and wherein the current source is coupled to the base of each transistor.

18. The epitaxial tub bias structure of claim 17, wherein the resistive element is coupled between the collectors of the first and second lateral PNP transistors.

19. The epitaxial tub bias structure of claim 18, wherein an emitter of the first lateral PNP transistor is coupled to the supply voltage and the emitter of the second lateral PNP transistor is coupled to the at least one region.

20. The epitaxial tub bias structure of claim 19, wherein the first and second lateral PNP transistors and the resistive element are integrated into respective epitaxial tubs in an integrated circuit and separated from each other by isolation regions.

21. The epitaxial tub bias structure of claim 20, wherein the respective epitaxial tubs are N-type.

22. The epitaxial tub bias structure of claim 21, wherein the isolation regions are P-type.

* * * * *